(12) United States Patent
Takahashi

(10) Patent No.: US 8,491,971 B2
(45) Date of Patent: Jul. 23, 2013

(54) METHOD OF PRODUCING GAS BARRIER LAYER

(75) Inventor: Toshiya Takahashi, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 600 days.

(21) Appl. No.: 12/730,538

(22) Filed: Mar. 24, 2010

(65) Prior Publication Data

US 2010/0247806 A1     Sep. 30, 2010

(30) Foreign Application Priority Data

Mar. 25, 2009   (JP) ................................. 2009-074172

(51) Int. Cl.
*H05H 1/24*     (2006.01)

(52) U.S. Cl.
USPC ................ 427/579; 427/8; 427/10; 427/569; 427/578

(58) Field of Classification Search
USPC ................. 427/578, 579, 8–10, 569
See application file for complete search history.

(56) References Cited

U.S. PATENT DOCUMENTS

| 4,865,872 | A  | * | 9/1989 | Pellatiro ........................... 427/9 |
| 6,811,831 | B1 | * | 11/2004 | Koutny et al. ................ 427/578 |
| 2006/0226517 | A1 | * | 10/2006 | Iwanaga et al. ............... 257/639 |
| 2008/0211066 | A1 | * | 9/2008 | Akedo et al. .................. 257/640 |

FOREIGN PATENT DOCUMENTS

JP         03-090576       *  4/1991

* cited by examiner

*Primary Examiner* — Timothy Meeks
*Assistant Examiner* — Elizabeth Burkhart
(74) *Attorney, Agent, or Firm* — Young & Thompson

(57) ABSTRACT

The producing method of a gas barrier layer uses a material having at least one Si—H bond, a material having at least one N—H bond, and at least one of nitrogen gas, hydrogen gas and a noble gas and forms the gas barrier layer by plasma-enhanced CVD using a plasma in which an emission intensity A of emission at 414 nm, an emission intensity B of emission at 336 nm, an emission intensity C of emission at 337 nm, and an emission intensity D of emission at 656 nm satisfy formulas a to c:

| $2<B/A<20$ | Formula a: |
| $C/B<2$ | Formula b: |
| $0.5<D/B<50.$ | Formula c: |

18 Claims, 2 Drawing Sheets

METHOD OF PRODUCING GAS BARRIER LAYER

BACKGROUND OF THE INVENTION

The present invention relates to a method of producing a gas barrier layer by using plasma-enhanced CVD. More specifically, the invention relates to a gas barrier layer production method capable of depositing a gas barrier layer having not only excellent gas barrier properties but also excellent oxidation resistance and high transparency.

A gas barrier layer (a water-vapor barrier layer) is formed not only on sites or parts requiring moisture resistance in various devices including optical devices, display devices (e.g. liquid-crystal displays and organic EL displays), semiconductor devices and thin-film solar batteries, but also in packaging materials used to package food, clothing, electronic components, etc.

Layers made of various materials such as silicon oxide, silicon oxynitride and aluminum oxide are known gas barrier layers. A gas barrier layer made of silicon nitride is known as one of those layers. Plasma-enhanced CVD is a known method of producing a gas barrier layer made of silicon nitride.

For example, US 2008/0211066 A1 describes a gas barrier layer production method in which a gas barrier layer made of silicon nitride is formed on a substrate surface by plasma-enhanced CVD using silane gas, ammonia gas and a carrier gas, wherein two or more silicon nitride sublayers having different Si/N composition ratios are deposited by maintaining the substrate temperature at 200° C. or less and adjusting the flow rate ratio of the ammonia gas to the silane gas.

The production method described in US 2008/0211066 A1 is capable of obtaining a gas barrier layer which exhibits high oxidation resistance in a high temperature and high humidity environment, has few pinholes and exhibits high transparency (optical transmittance).

SUMMARY OF THE INVENTION

An oxidized gas barrier layer reduces the gas barrier properties, whereby desired gas barrier properties cannot be exhibited. Optical applications including displays and lenses require high transparency in order to prevent the device performance from deteriorating.

To this end, as also described in US 2008/0211066 A1, the gas barrier layer is required to have excellent gas barrier properties, transparency and oxidation resistance depending on the intended use, and a variety of gas barrier layers and gas barrier layer production methods have been proposed. However, increasingly strict requirements are recently imposed on those properties of the gas barrier layer, and some of commonly used gas barrier layers do not satisfy the required performance. For example, the gas barrier layer of a two-sublayer structure described in US 2008/0211066 A1 which includes a sublayer containing a large amount of silicon and exhibiting excellent oxidation resistance can achieve excellent oxidation resistance but may often not achieve high performance in terms of transparency because of the presence of the sublayer containing a large amount of silicon.

Accordingly, a production method has been desired with which a gas barrier layer having more excellent gas barrier properties, transparency and oxidation resistance can be consistently produced.

In order to solve the aforementioned prior art problems, an object of the present invention is to provide a gas barrier layer production method capable of consistently depositing a gas barrier layer which can exhibit excellent gas barrier properties even in a monolayer structure and also exhibits excellent transparency and oxidation resistance.

In order to achieve the above object, the present invention provides a method of producing a gas barrier layer comprising: using a material having at least one Si—H bond, a material having at least one N—H bond, and at least one of nitrogen gas, hydrogen gas and a noble gas; and forming the gas barrier layer by plasma-enhanced CVD using a plasma in which an emission intensity A of emission at 414 nm, an emission intensity B of emission at 336 nm, an emission intensity C of emission at 337 nm, and an emission intensity D of emission at 656 nm satisfy formulas a to c:

$$2 < B/A < 20 \quad \text{Formula a:}$$

$$C/B < 2 \quad \text{Formula b:}$$

$$0.5 < D/B < 50. \quad \text{Formula c:}$$

Preferably, the emission intensities A to D are measured and at least one of plasma excitation power, pressure control means and each amount of supplied materials is feedback-controlled based on measurement results so that the formulas a to c are satisfied.

The gas barrier layer is preferably formed on an elongated substrate traveling in a longitudinal direction.

A region where the gas barrier layer was formed in a state in which at least one of the formulas a to c was not satisfied for at least 1 consecutive second is preferably detected.

The region is preferably marked where the gas barrier layer was formed in the state in which at least one of the formulas a to c was not satisfied for at least 1 consecutive second.

Marking is preferably made to put visible marks on the region.

Marking is preferably made outside a region for use as a product.

The gas barrier layer is preferably formed on a substrate made of an organic material or a substrate having an organic base material.

The gas barrier layer is preferably formed with a substrate temperature kept at 120° C. or less.

Preferably, the gas barrier layer is formed on a substrate and at least a part of a surface of the substrate is formed with an organic material.

Another gas barrier layer is preferably deposited on a substrate having the gas barrier layer formed by this method.

Preferably, the gas barrier layer is formed as AC or DC bias power is applied to a substrate, the emission intensities A to D are measured and the bias power applied to a substrate is feedback-controlled based on measurement results so that the formulas a to c are satisfied.

The present invention is capable of consistently producing a gas barrier layer which exhibits excellent gas barrier properties even in a monolayer structure and is excellent not only in the gas barrier properties but also oxidation resistance in a high temperature and high humidity environment and transparency in a visible light region by using a material having at least one Si—H bond, a material having at least one N-H bond, and at least one of nitrogen, hydrogen and a noble gas, and by forming the gas barrier layer with the plasma state controlled in accordance with emission at specified wavelengths due to generated radicals. The gas barrier layer has excellent gas barrier properties even in the monolayer structure and the present invention can therefore minimize the reduction of the transparency due to the multilayer structure of the gas barrier layer while improving the productivity.

Therefore, the present invention is advantageously used in various applications requiring the gas barrier layer which has not only high gas barrier properties but also high transparency and oxidation resistance, as exemplified by the production of various displays and lighting devices using organic ELs and liquid crystals and the production of solar batteries.

DETAILED DESCRIPTION OF THE INVENTION

Next, the method for producing a gas barrier layer according to the present invention is described in detail by referring to the preferred embodiment shown in the accompanying drawings.

Figure 1:
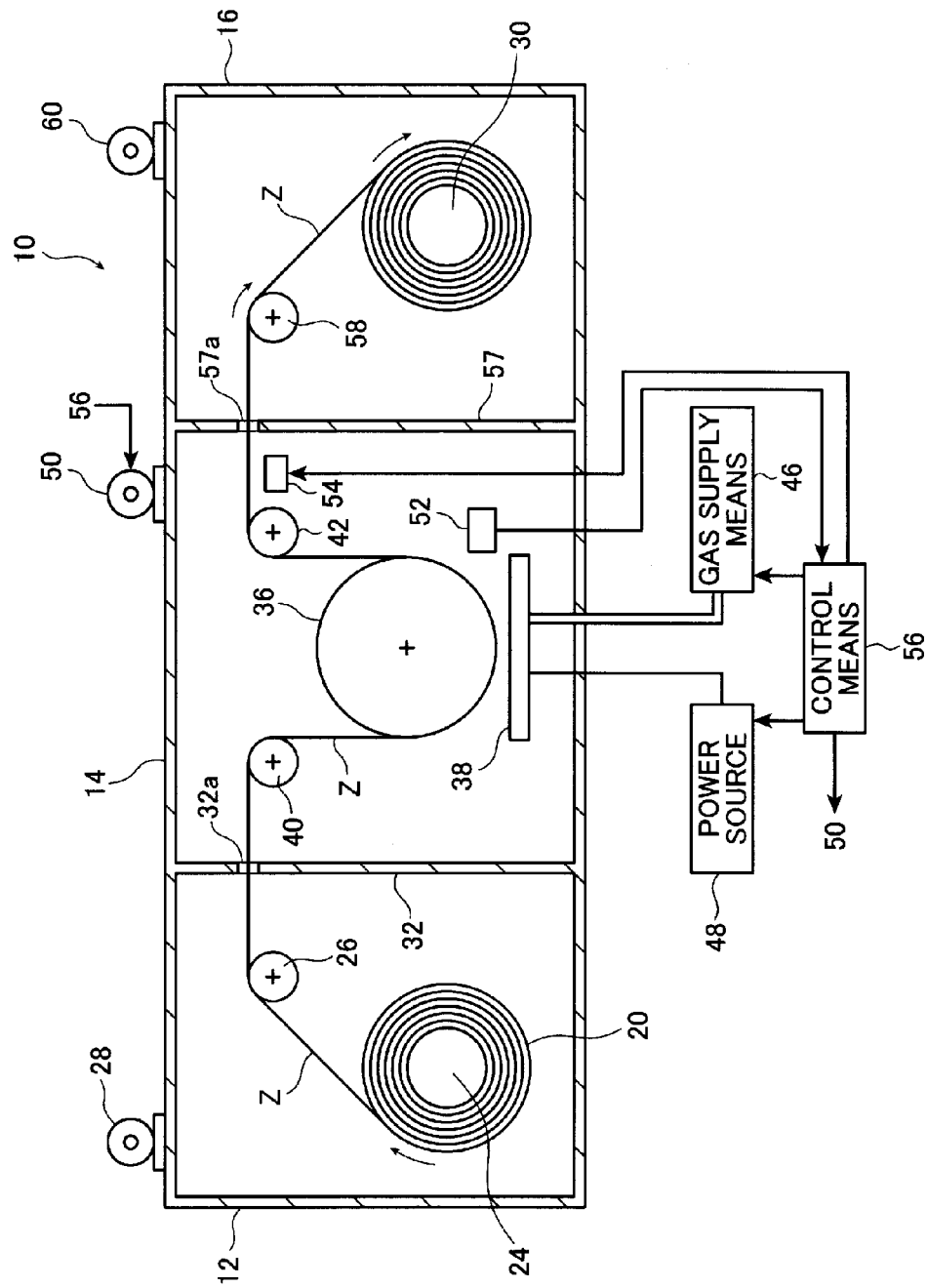
FIG. 1 is a schematic view showing an embodiment of the production device for implementing the gas barrier layer production method of the present invention.

FIG. 1 is a schematic view showing an embodiment of the production device for implementing the gas barrier layer production method of the present invention.

The illustrated gas barrier layer production device 10 produces a gas barrier film by depositing or forming a gas barrier layer by plasma-enhanced CVD on a surface of an elongated substrate Z, that is, a film material as it travels in a longitudinal direction.

This production device 10 is a film deposition device by a so-called roll-to-roll system with which the substrate Z is fed from a substrate roll 20 having the elongated substrate Z wound into a roll, a gas barrier layer is formed on the substrate Z traveling in the longitudinal direction and the substrate Z having the gas barrier layer formed thereon, that is, the gas barrier film is wound into a roll.

In the production method of the present invention, an example of the substrate (substrate for film deposition) that may be preferably used includes an elongated sheet as in the illustrated case, but various articles (members/base materials) including a film cut into a sheet with a predetermined length (i.e., cut sheet), optical devices such as lenses and optical filters, photoelectric transducers such as organic EL devices and solar batteries, and display panels such as liquid-crystal displays and electronic paper may also be advantageously used for the substrate.

The material of the substrate is also not particularly limited and various materials may be used as long as a gas barrier layer can be formed by plasma-enhanced CVD. The substrate may be made of organic materials such as plastic films (resin films) or of inorganic materials such as metals and ceramics.

As described later in detail, the gas barrier layer deposited by the production method of the present invention has highly excellent oxidation resistance and has therefore poor chemical/physical compatibility with silicon nitride compared to a silicon wafer substrate and a metallic substrate, and can be advantageously used particularly in applications in which a material such as a plastic film having difficulty in achieving high barrier properties and high oxidation resistance is used for the substrate (base material). Specific examples of the substrate that may be advantageously used include substrates made of organic materials such as polyethylene terephthalate (PET), polyethylene naphthalate, polyethylene, polypropylene, polystyrene, polyamide, polyvinyl chloride, polycarbonate, polyacrylonitrile, polyimide, polyacrylate, and polymethacrylate.

In the present invention, base materials such as plastic films and lenses having layers (films) formed thereon to impart various functions may be used for the substrate. Exemplary layers include a protective layer, an adhesive layer, a light-reflecting layer, a light-shielding layer, a planarizing layer, a buffer layer, and a stress-relief layer.

Figure 2:
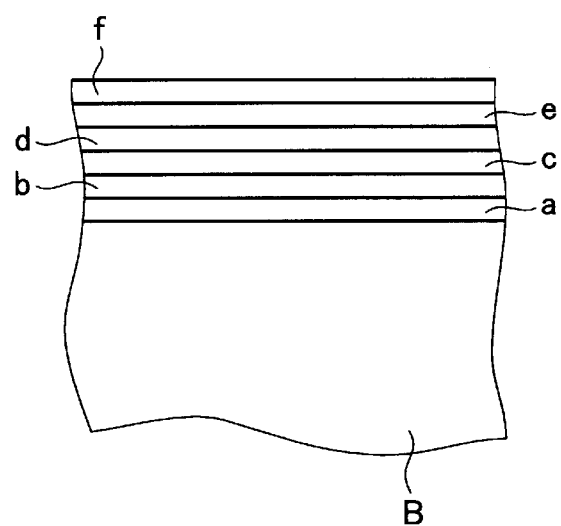
FIG. 2 is a schematic view showing an exemplary substrate for use in the production method of the present invention.

The substrate used may be one having one layer formed on a base material or one having a plurality of layers such as layers a to f formed on a base material B as conceptually shown in FIG. 2. In a substrate having one or more than one layer formed on the base material B, at least one of the layers (at least one of the layers a to f in FIG. 2) may be a gas barrier layer formed by the production method of the present invention. A substrate having the gas barrier layers of the present invention and other layers formed alternately may also be advantageously used, and in this case, the layers other than the gas barrier layers may be made of a single material or different materials.

At least one of the layers (at least one of the layers a to f in FIG. 2) may also be patterned.

In cases where irregularities or foreign substances having considerably larger sizes than the thickness of the gas barrier layer are formed at the surface of the substrate, the gas barrier properties deteriorate, making it impossible to obtain desired gas barrier properties even if high oxidation resistance is achieved.

Therefore, the substrate used is preferably one which has a sufficiently smooth surface and to which few foreign substances adhere.

As described above, the production device 10 shown in FIG. 1 is a film deposition device by a so-called roll-to-roll system in which the substrate Z is fed from the substrate roll 20 having the elongated substrate Z wound into a roll, a gas barrier layer is formed on the substrate Z traveling in the longitudinal direction and the substrate Z having the gas barrier layer formed thereon is rewound into a roll. The production device 10 includes a feed chamber 12, a film deposition chamber 14 and a take-up chamber 16.

In addition to the illustrated members, the production device 10 may also have various members of a plasma CVD device by means of a roll-to-roll system including various sensors, and various members (transport means) for transporting the substrate Z along a predetermined path, as exemplified by a transport roller pair and a guide member for regulating the position in the width direction of the substrate Z. In addition, the production device 10 may include a plurality of plasma CVD film deposition chambers. Alternatively, at least one film deposition chamber for depositing a film by other vapor deposition techniques than plasma-enhanced CVD, flash evaporation or sputtering and/or at least one surface treatment chamber for plasma treatment may be connected to the production device.

The feed chamber 12 includes a rotary shaft 24, a guide roller 26 and a vacuum evacuation means 28.

The substrate roll 20 into which the elongated substrate Z is wound is mounted on the rotary shaft 24 of the feed chamber 12.

Upon mounting of the substrate roll 20 on the rotary shaft 24, the substrate Z travels along a predetermined travel path starting from the feed chamber 12 and passing through the film deposition chamber 14 to reach a take-up shaft 30 of the take-up chamber 16.

Feeding of the substrate Z from the substrate roll 20 and winding of the substrate Z on the take-up shaft 30 of the take-up chamber 16 are carried out in synchronism in the production device 10 to continuously form the gas barrier layer on the elongated substrate Z in the film deposition chamber 14 by plasma-enhanced CVD as the substrate Z travels in its longitudinal direction along the predetermined travel path.

In the feed chamber 12, the rotary shaft 24 is rotated by a drive source (not shown) in a clockwise direction in FIG. 1 so that the substrate Z is fed from the substrate roll 20, is guided by the guide roller 26 along the predetermined path and passes through a slit 32a provided in a partition wall 32 to reach the film deposition chamber 14.

In the preferred embodiment of the illustrated production device 10, the feed chamber 12 and the take-up chamber 16 are provided with vacuum evacuation means 28 and 60, respectively. The pressures in the neighboring chambers are prevented from affecting the degree of vacuum in the film deposition chamber 14 (formation of the gas barrier layer) by providing the vacuum evacuation means in these chambers so that the chambers may have during film deposition the same degree of vacuum (pressure) as the film deposition chamber 14 to be described later.

The vacuum evacuation means 28 is not particularly limited, and exemplary means that may be used include vacuum pumps such as a turbo pump, a mechanical booster pump, a dry pump, and a rotary pump, an assist means such as a cryogenic coil, and various other known (vacuum) evacuation means which use a means for adjusting the ultimate degree of vacuum or the amount of air discharged and are employed in vacuum deposition devices. In this regard, the same holds true for other vacuum evacuation means 50 and 60.

The present invention is not limited to the embodiment in which all the chambers are provided with vacuum evacuation means, and the feed chamber 12 and the take-up chamber 16 which require no vacuum evacuation treatment may not be provided with vacuum evacuation means. However, in order to minimize the adverse effect of the pressures in these chambers on the degree of vacuum in the film deposition chamber 14, the size of the portion such as the slit 32a through which the substrate Z passes may be made as small as possible, or a subchamber may be provided between the adjacent chambers so that the internal pressure of the subchamber is reduced.

Even in the illustrated production device 10 in which all the chambers have the vacuum evacuation means, it is preferred to minimize the size of the portion such as the slit 32a through which the substrate Z passes.

As described above, the substrate Z is guided by the guide roller 26 to reach the film deposition chamber 14.

The film deposition chamber 14 is used to deposit or form a gas barrier layer on a surface of the substrate Z by capacitively coupled plasma-enhanced CVD (hereinafter abbreviated as CCP-CVD).

The plasma-enhanced CVD used in the present invention is not limited to CCP-CVD as in the illustrated case, and various types of plasma-enhanced CVD including inductively coupled plasma-enhanced CVD (ICP-CVD), microwave plasma CVD, electron cyclotron resonance CVD (ECR-CVD) and atmospheric pressure barrier discharge CVD are all available. The same principle can be applied to obtain the same effect even in catalytic CVD (Cat-CVD) if there is emission at the wavelengths according to the present invention.

In the illustrated embodiment, the film deposition chamber 14 includes a drum 36, a shower head electrode 38, guide rollers 40 and 42, a gas supply means 46, an RF power source 48, the vacuum evacuation means 50, a plasma emission measurement means 52, a marking means 54, and a control means 56.

The drum 36 in the film deposition chamber 14 is a cylindrical member rotating about the central axis in the counter-clockwise direction in FIG. 1, and the substrate Z guided by the guide roller 40 along the predetermined path is wrapped over a predetermined region of the peripheral surface to travel in the longitudinal direction as the substrate Z is held at a predetermined position facing the shower head electrode 38 to be described later.

The drum 36 also serves as a counter electrode in CCP-CVD and forms an electrode pair with the shower head electrode 38.

To this end, the drum 36 is connected to a bias power source or grounded (connection is not shown in both the cases). Alternatively, the drum 36 may be capable of switching between connection to the bias power source and grounding.

In the production method of the present invention, the gas barrier layer is preferably formed by adjusting the temperature of the substrate to 120° C. or less. It is particularly preferred to form the gas barrier layer by adjusting the temperature of the substrate to 80° C. or less.

By adjusting the temperature of the substrate to 120° C. or less, preferred results are obtained in that a gas barrier layer having advantageously high gas barrier properties and oxidation resistance and a low-stress gas barrier layer can be formed on a less heat-resistant plastic film substrate such as a PEN substrate or on a substrate using a less heat-resistant organic material as the base material. In addition, by adjusting the temperature of the substrate to 80° C. or less, preferred results are obtained in that a gas barrier layer having advantageously high gas barrier properties and oxidation resistance and a low-stress gas barrier layer can be formed on a less heat-resistant plastic film substrate such as a PET substrate.

In order to form the gas barrier layer at 120° C. or less in the illustrated production device 10, the drum 36 preferably serves as the temperature adjusting means for keeping the substrate Z at a temperature of 120° C. or less, in other words, the temperature adjusting means is preferably built into the drum 36.

The temperature adjusting means of the drum 36 is not particularly limited and various types of temperature adjusting means including one in which a refrigerant is circulated and a cooling means using a piezoelectric element are all available.

The shower head electrode 38 is of a known type used in film deposition by means of CCP-CVD.

In the illustrated embodiment, the shower head electrode 38 is, for example, in the form of a hollow rectangular solid and is disposed so that its largest surface faces the peripheral surface of the drum 36 and the perpendicular from the center of the largest surface coincides with the normal of the drum 36 with respect to its peripheral surface. A large number of through holes are formed at the whole surface of the shower head electrode 38 facing the drum 36.

In the illustrated production device 10, one shower head electrode (film deposition means by CCP-CVD) is provided in the film deposition chamber 14. However, this is not the sole case of the present invention and a plurality of shower head electrodes may be disposed in the direction of travel of the substrate Z. In this regard, the same holds true when using plasma-enhanced CVD of other type than CCP-CVD. For example, when a gas barrier layer is formed or produced by ICP-CVD, a plurality of (induction) coils for forming an induced electric field (induced magnetic field) may be provided along the direction of travel of the substrate Z.

The present invention is not limited to the case in which the gas barrier layer is formed by using the shower head electrode, and the gas barrier layer may be formed by using a common electrode in plate form and a gas supply nozzle.

The gas supply means 46 is of a known type used in vacuum deposition devices such as plasma CVD devices, and supplies a material into the shower head electrode 38.

As described above, a large number of through holes are formed at the surface of the shower head electrode 38 facing the drum 36. Therefore, the material supplied into the shower head electrode 38 passes through the through holes to be introduced into the space between the shower head electrode 38 and the drum 36.

The production device 10 for implementing the production method of the present invention uses a material having at least one Si—H bond, a material having at least one N—H bond, and at least one of nitrogen gas, hydrogen gas and a noble gas. In other words, the present invention forms a silicon nitride film for the gas barrier layer.

The gas barrier layer produced by the production method of the present invention may of course include not only silicon nitride but also hydrogen or other various substances inevitably incorporated therein. The gas barrier layer produced by the production method of the present invention may be of a crystalline or amorphous structure, or of a combination of both the structures.

Compounds having at least one Si—H bond can all be used for the material having at least one Si—H bond.

Specific examples thereof include silane, disilane and trimethylsilane (TMS). Of these, silane and disilane are preferred.

A plurality of materials having at least one Si—H bond may be used in combination.

Compounds having at least one N—H bond can all be used for the material having at least one N—H bond.

Exemplary materials include ammonia and hydrazine. Of these, ammonia is preferred.

A plurality of materials having at least one N—H bond may be used in combination.

In addition to these materials, the present invention further uses at least one of nitrogen gas, hydrogen gas and a noble gas.

These material gases may be used alone or in combination but nitrogen gas combined with hydrogen gas, nitrogen gas combined with helium gas, and nitrogen gas combined with argon gas are preferred.

The production method of the present invention is not limited to the embodiment in which gases (gaseous material) are used for the material of the gas barrier layer and a liquid material may be used and vaporized to form the gas barrier layer. Alternatively, the gaseous material and the liquid material may be used in combination to form the gas barrier layer.

The RF power source 48 is one for supplying plasma excitation power to the shower head electrode 38. Known RF power sources used in various plasma CVD devices can be all used for the RF power source 48.

In addition, the vacuum evacuation means 50 evacuates the film deposition chamber 14 to keep it at a predetermined film deposition pressure in order to form the gas barrier layer by plasma-enhanced CVD, and is of a known type used in vacuum deposition devices as described above.

The control means 56 controls the operations of the gas supply means 46, the RF power source 48 and the vacuum evacuation means 50. The control means 56 will be described later in detail.

The plasma emission measurement means 52 is a portion where the emission intensity of emission at 414 nm (emission intensity A), the emission intensity of emission at 336 nm (emission intensity B), the emission intensity of emission at 337 nm (emission intensity C) and the emission intensity of emission at 656 nm (emission intensity D) are measured during the deposition of the gas barrier layer by plasma-enhanced CVD and supplied to the control means 56.

The position at which the plasma emission measurement means 52 measures the emission intensities at the respective wavelengths is not limited as long as the plasma emission can be detected at that position. However, in order to obtain the benefits of the present invention more effectively, the emission intensities are preferably measured at such a distance from the plasma that no disturbance is given to the plasma and a satisfactory S/N ratio is obtained, and the position at which the emission in the uniform discharge region near the center of the discharge volume can be detected is preferred.

It is preferred to obtain each of the emission intensities according to the present invention by subtracting the background (signal intensity when the plasma is off) from the signal intensity at which the plasma emission was measured.

As described above, the production method of the present invention uses the material having at least one Si—H bond, the material having at least one N—H bond and at least one of nitrogen gas, hydrogen gas and a noble gas to form the gas barrier layer by plasma-enhanced CVD.

In the gas barrier layer (silicon nitride film) deposition system using such materials, the emission at 414 nm (emission intensity A) is mainly derived from SiH radicals, the emission at 336 nm (emission intensity B) is mainly derived from NH radicals, the emission at 337 nm (emission intensity C) is mainly derived from $N_2$ radicals, and the emission at 656 nm (emission intensity D) is mainly derived from H radicals.

By depositing the gas barrier layer using the plasma in which the 4 emission intensities A to D satisfy formulas a to c to be described later, the production method of the present invention is capable of consistently producing the gas barrier layer which is excellent not only in the gas barrier properties but also in the oxidation resistance in a high temperature and high humidity environment and the transparency.

In the production method of the present invention, the plasma emission measurement means 52 is not particularly limited, and various types of spectrometers and spectrophotometers with which the emission intensity can be measured by dividing light into the four wavelength components can all be used, and commercially available spectrometers and spectrophotometers having such performance may be used.

In response to the command from the control means 56, the marking means 54 marks a region where the plasma state did not satisfy one of formulas a to c for 1 second or more. Marking will be described later in further detail.

The marking method using the marking means 54 is not particularly limited and marking methods capable of detection after the gas barrier layer has been formed are all available.

For example, in cases where the gas barrier film (product using the inventive production method) is transparent, it is preferred to put visible marks as by laser marking with laser beams or by coloring using various recording heads.

The mark may be one capable of detection with infrared light or ultraviolet light. Alternatively, marking may be made by perforation with laser beams or mechanical means.

The marking position is also not particularly limited but is preferably outside the region for use as the product in the substrate having the gas barrier layer formed thereon. For example, the elongated substrate Z as in the illustrated embodiment is preferably marked in the vicinity of an end in its width direction perpendicular to the longitudinal direction.

Marking may be made on the gas barrier layer or the back surface of the substrate Z on which no gas barrier layer was deposited. The gas barrier layer may be cracked due to the marking depending on the strength of the gas barrier layer and the magnitude of impact from the marking. Therefore, in view of this point, it is more advantageous to mark the back surface of the substrate Z.

In addition, marking may be continuously made over the whole region where the plasma state does not satisfy formulas a to c. Alternatively, marking may be made at the forward end and the rear end of the region where the plasma state does not satisfy formulas a to c so that the forward end and the rear end may be identified.

Upon receipt of the measurement results of the emission intensities A to D from the plasma emission measurement means 52, the control means 56 controls the amount of at least one material supplied from the gas supply means 46, the plasma excitation power supplied from the RF power source 48, and the amount of air discharged from the film deposition chamber 14 by the vacuum evacuation means 50 such that the plasma for depositing the gas barrier layer by plasma-enhanced CVD using the foregoing materials has the emission intensities A to D satisfying the following three formulas:

$$2 < B/A < 20 \qquad \text{Formula a:}$$

$$C/B < 2 \qquad \text{Formula b:}$$

$$0.5 < D/B < 50. \qquad \text{Formula c:}$$

Instead of or in addition to the above factors, the control means 56 may control the substrate bias power so as to satisfy the three formulas in cases where the drum 36 is used to apply AC or DC bias power to the substrate Z.

In various film deposition techniques by means of plasma-enhanced CVD, it is known to measure the emission derived from radicals existing in the film deposition system and to control the film deposition in accordance with the measured emission intensities.

The inventor of the present invention has made intensive studies on the control of the film deposition using emission derived from radicals existing in the film deposition system in order to obtain a gas barrier layer having excellent gas barrier properties, oxidation resistance in a high temperature and high humidity environment and transparency (optical transparency in a visible light region) in the production of the gas barrier layer by means of plasma-enhanced CVD using the material having at least one Si—H bond such as silane, the material having at least one N—H bond such as ammonia and at least one of nitrogen gas, hydrogen gas and a noble gas.

As a result, it has been found that the ratios between the emission intensity A of emission at 414 nm of those derived from SiH radicals, the emission intensity B of emission at 336 nm of those derived from NH radicals, the emission intensity C of emission at 337 nm of those derived from $N_2$ radicals, and the emission intensity D of emission at 656 nm of those derived from H radicals are suitable indicators of the gas barrier properties, oxidation resistance and transparency of the gas barrier layer.

In addition, it has also been found that the gas barrier layer having excellent gas barrier properties, oxidation resistance and transparency is obtained by the film deposition using such a plasma that the ratios B/A, C/B and D/B of the emission intensities at the respective wavelengths derived from the radicals may fall within proper ranges.

As described above, formula a is represented by $2 < B/A < 20$.

More specifically, formula a shows the relationship between the emission intensity A at 414 nm derived from SiH radicals and the emission intensity B at 336 nm derived from NH radicals.

In the deposition of the gas barrier layer by means of plasma-enhanced CVD using the above-described materials, a too small amount of the nitrogen source with respect to the silicon source tends to lower the transparency, whereas a too large amount of the nitrogen source tends to lower the oxidation resistance. Therefore, the plasma having a ratio B/A of 2 or less cannot ensure sufficient transparency. On the other hand, the plasma having a ratio B/A of 20 or more cannot achieve sufficient oxidation resistance.

B/A is preferably in the range of $3 < B/A < 12$. More preferred results can be obtained at a ratio B/A within the above-defined range because more excellent transparency and oxidation resistance can be ensured, more excellent gas barrier properties can be obtained, and the material costs can be reduced.

Formula b is represented by $C/B < 2$.

More specifically, formula b shows the relationship between the emission intensity C at 337 nm derived from $N_2$ radicals and the emission intensity B at 336 nm derived from NH radicals.

In the deposition of the gas barrier layer by means of plasma-enhanced CVD using the above-described materials, a too large amount of nitrogen source tends to lower the oxidation resistance of the gas barrier layer and particularly $N_2$ gas tends to more adversely affect the oxidation resistance than $NH_3$ gas. This is presumably because $N_2$ radicals formed from $N_2$ gas more adversely affect the oxidation resistance than NH radicals formed from $NH_3$ containing gas such as $NH_3$ gas. Therefore, the plasma having a ratio C/B of 2 or more cannot achieve sufficient oxidation resistance.

C/B is preferably in the range of $0.1 < C/B < 1.7$. More preferred results can be obtained at a ratio C/B within the above-defined range because higher oxidation resistance can be obtained and the material costs can be reduced.

Formula c is represented by $0.5 < D/B < 50$.

More specifically, formula c shows the relationship between the emission intensity D at 656 nm derived from H radicals and the emission intensity B at 336 nm derived from NH radicals.

In other words, formula c is indicative of the degree of degradation of the material having at least one N—H bond and the degree of degradation of the material having at least one Si—H bond. At a plasma having a ratio D/B of 0.5 or less, the degradation of the material having at least one N—H bond is too small, making it impossible to obtain sufficient gas barrier properties and oxidation resistance. On the other hand, in the plasma having a ratio D/B of at least 50, a too large amount of H radicals is present within the film deposition system to cause inconveniences such as deterioration of the flexibility of the gas barrier film and reduction of the film deposition rate, that is, productivity. The transparency is also reduced because of a small amount of nitrogen source.

D/B is preferably in the range of $1 < D/B < 20$. More preferred results can be obtained at a ratio D/B within this range because more excellent gas barrier properties and oxidation resistance can be obtained, sufficient flexibility is obtained, sufficient transparency is obtained, excellent gas barrier properties and oxidation resistance can be consistently obtained under varying film deposition conditions and varying emission intensities, and the material costs can be reduced (the film deposition rate can be improved).

In addition, a combination of formula a with formula c also enables the preferred range of D/A to be defined to obtain a preferred degree of degradation in the material having at least one Si—H bond.

As described above, the gas barrier layer produced by the production method of the present invention has not only excellent gas barrier properties but also excellent oxidation resistance and transparency.

For example, the gas barrier film for use in solar batteries is required to be able to have a moisture vapor transmission rate of not more than $3 \times 10^{-3}$ [g/(m$^2$·day)] and to retain the gas barrier properties even in an environment of 85° C. and 85% RH (e.g., even after having been allowed to stand for 1000 hours). The gas barrier film for use in various displays such as organic EL displays is required to be able to have a higher moisture vapor transmission rate of not more than $1 \times 10^{-5}$ [g/(m$^2$·day)] and to retain the gas barrier properties even in an environment of 60° C. and 90% RH (e.g., even after having been allowed to stand for 1000 hours).

The production method of the present invention is capable of consistently producing the gas barrier films satisfying both the requirements. According to the present invention, the gas barrier layer has excellent oxidation resistance and therefore there is no need to separately deposit an inorganic film for ensuring the oxidation resistance. In addition, the production method of the present invention can form the gas barrier layer that has excellent gas barrier properties even in the monolayer structure. Accordingly, the present invention can minimize the reduction of the transparency due to the deposition of another layer and also the reduction of the productivity due to an increase in the number of layers.

The side of the gas barrier layer contacting the substrate may be oxidized when an organic material having low gas barrier properties such as a PET film, a polyacrylate film or a polymethacrylate film is used for the substrate Z or the base material of the substrate Z during the production of the gas barrier film having the gas barrier layer deposited on the elongated substrate Z as in the illustrated production device 10.

In other words, in cases where a gas barrier film is produced by depositing the gas barrier layer on the substrate Z having low gas barrier properties and the produced gas barrier film is exposed to an easily-oxidizable environment during storage in a warehouse or during the transport, moisture in the environment permeate the substrate Z to reach and oxidize the gas barrier layer. As a result, the gas barrier layer is oxidized not only on the surface side contacting air but also at the interface with the substrate Z. In this way, the gas barrier layer is oxidized on both sides of the surface contacting air and the surface contacting the substrate Z to deteriorate the gas barrier properties.

In contrast, the gas barrier layer produced by the production method of the present invention has highly excellent oxidation resistance and can therefore prevent not only the oxidation of the surface contacting air but also the oxidation of the surface contacting the substrate Z due to moisture that has permeated the substrate Z to reach the gas barrier layer.

In other words, the gas barrier layer production method of the present invention can be used with particular advantage for producing or depositing the gas barrier layer on the substrate or base material comprising an organic material having low gas barrier properties such as a PET film, a PEN film, a polyacrylate film or a polymethacrylate film.

As described above, the gas barrier layer produced according to the present invention also has excellent transparency.

The present invention can consistently produce a gas barrier layer having an average visible light transmittance at 400 to 700 nm of at least 88%. Therefore, the present invention can be more advantageously used for the applications requiring the transparency such as production of a gas barrier film for various displays and a gas barrier film for solar batteries.

In cases where a PET film having a transmittance of 89% is used for the substrate, the gas barrier layer itself is required to have a transmittance of at least 98% in order to achieve a gas barrier film transmittance of at least 88%. Although it is very difficult to ensure the transparency in the gas barrier layer which contains a large amount of silicon and has excellent oxidation resistance, the production method of the present invention is capable of easily producing such a gas barrier layer in a consistent manner.

There is no particular limitation on the film deposition conditions in the gas barrier layer production method of the present invention except that the gas barrier layer is formed by using the plasma which has the emission intensities A to D satisfying formulas a to c.

Therefore, as in the formation of a silicon nitride film for the gas barrier layer by a conventional plasma-enhanced CVD technique, the conditions of film deposition such as the flow rates of the materials, the film deposition pressure, the plasma excitation power, and the frequency of the plasma excitation power may be appropriately set in accordance with the film deposition rate to be applied, the thickness of the gas barrier layer to be obtained, the types of the materials used, the layout and size of the film deposition chamber, and the physical properties of the substrate Z or the base material of the substrate Z such that the above formulas may be satisfied.

The thickness of the gas barrier layer is also not particularly limited and may be appropriately set in accordance with the application and the required gas barrier properties so that sufficient gas barrier properties may be exhibited. However, the gas barrier layer preferably has a thickness of at least 5 nm because the gas barrier layer surface may be almost naturally oxidized at a gas barrier layer thickness of less than 5 nm.

A film having low oxidation resistance is easily formed at a film deposition rate of more than 300 nm/min with the substrate Z at rest (in terms of static film deposition rate). Therefore, the effect of the present invention that the gas barrier layer formed has excellent gas barrier properties and oxidation resistance can be more advantageously achieved by depositing the gas barrier layer at the above-defined film deposition rate.

The control means 56 and the marking means 54 as well as the method of producing the gas barrier layer according to the present invention are described below in further detail by referring to the operations for forming the gas barrier layer in the film deposition chamber 14.

As described above, upon mounting of the substrate roll 20 on the rotary shaft 24, the substrate Z is let out from the substrate roll 20 and travels along the predetermined travel path along which the substrate Z in the feed chamber 12 is guided by the guide roller 26 to reach the film deposition chamber 14, where the substrate Z is guided by the guide roller 40, wrapped over a predetermined region of the peripheral surface of the drum 36 and guided by the guide roller 42 to reach the take-up chamber 16, where the substrate Z is guided by a guide roller 58 to reach the take-up shaft 30.

The substrate Z fed from the feed chamber 12 and guided by the guide roller 40 along the predetermined path travels on the predetermined travel path as it is supported/guided by the drum 36. The internal pressure of the film deposition chamber 14 is reduced by the vacuum evacuation means 50 to a predetermined degree of vacuum. The internal pressures of the feed chamber 12 and the take-up chamber 16 are reduced by the vacuum evacuation means 28 and 60 to predetermined degrees of vacuum, respectively.

In addition, the gas supply means 46 supplies to the shower head electrode 38 materials, more specifically the material having at least one Si—H bond, the material having at least one N—H bond, and at least one of nitrogen gas, hydrogen gas and a noble gas. In this way, the materials are supplied from the shower head electrode 38 to the space between the shower head electrode 38 and the substrate Z or the drum 36.

Upon stabilization of the amounts of supplied materials and the degree of vacuum in the film deposition chamber 14, the RF power source 48 supplies the plasma excitation power to the shower head electrode 38.

In the illustrated production device 10, the drum 36 serves as a counter electrode and forms with the shower head electrode 38 an electrode pair in CCP-CVD, as described above.

The plasma excitation power is supplied to the shower head electrode 38 to cause plasma excitation in the space between the shower head electrode 38 and the drum 36 to generate radicals from the materials, whereby the gas barrier layer is formed by CCP-CVD on the surface of the substrate Z which is traveling as it is supported by the drum 36.

In the film deposition chamber 14, the plasma emission measurement means 52 measures the emission intensity A at 414 nm, the emission intensity B at 336 nm, the emission intensity C at 337 nm and the emission intensity D at 656 nm during the deposition of the gas barrier layer and sends the measurements to the control means 56.

Upon receipt of the measurement results on the plasma emission intensity, the control means 56 calculates B/A, C/B and D/B and determines whether the calculated values fall within the specified ranges defined by formulas a to c.

In cases where the emission intensities A to D do not satisfy at least one of formulas a to c, the control means 56 adjusts at least one of the plasma excitation power supplied from the RF power source 48 to the shower head electrode 38, the flow rate of at least one material supplied from the gas supply means 46 to the shower head electrode 38, and the amount of air discharged by the vacuum evacuation means 50 so that the plasma may have the emission intensities A to D satisfying all of formulas a to c.

More specifically, the control means 56 measures the emission intensity A of emission at 414 nm derived from SiH radicals, emission intensity B of emission at 336 nm derived from NH radicals, the emission intensity C of emission at 337 nm derived from $N_2$ radicals, and the emission intensity D of emission at 656 nm derived from H radicals, and feedback-controls at least one of the plasma excitation power, the amount of at least one material supplied and film deposition pressure based on the measurement results of the emission intensity from the plasma emission measurement means 52 such that the plasma may have the emission intensities A to D satisfying all of formulas a to c. In cases where the bias power is applied to the substrate, the control means 56 may feedback-control the substrate bias power so that the plasma may have the emission intensities A to D satisfying all of formulas a to c. The feedback control of the substrate bias power may be carried out instead of or in addition to the control of the plasma excitation power.

As described above, the present invention is capable of consistently producing the gas barrier layer having excellent gas barrier properties, oxidation resistance and transparency over a long period of time not under the control based on the device parameters but under the control in accordance with the plasma state during film deposition.

In actually measuring the emission intensities at the wavelengths derived from the radicals, the wavelength offset (initial displacement) may often be different depending on the plasma emission measurement means 52 (spectrometer). In such a case, modification of the wavelength at which measurement is made, adjustment of the measurement means and correction may be appropriately performed in accordance with the characteristics (e.g., wavelength offset) of the plasma emission measurement means 52 used such that the emission intensities at the wavelengths derived from SiH radicals, NH radicals, $N_2$ radicals and H radicals may be measured, respectively.

The wavelength of the emission intensity B (336 nm) is close to that of the emission intensity C (337 nm) and both the intensities may overlap each other. However, peak separation using information processing is not necessary if the emission intensities at both the wavelengths can be measured separately.

In cases where the emission intensities A to D do not satisfy at least one of formulas a to c for at least 1 consecutive second (this state is hereinafter also referred to as "improper state"), the control means 56 issues a command to the marking means 54 to cause the marking means 54 to mark the region where the gas barrier layer was formed in this improper state (this region is hereinafter also referred to as "improper region"). For example in cases where the improper state continued for 1 second or more, the control means 56 detects the whole region of the substrate Z that faced the shower head electrode 38 from the beginning of the improper state to the restoration of the proper state after the end of the improper state and issues a command to the marking means 54 to cause the marking means 54 to mark the detected whole region as the improper region.

In response to the command, the marking means 54 marks the surface of the gas barrier layer by, for example, laser marking with laser beams.

The improper region where the gas barrier layer was formed with the improper state continued for 1 second or more has no desired performance and is preferably removed.

Therefore, such a marking operation facilitates the detection of any improper region after the gas barrier layer has been formed.

In the meantime, the substrate used in the production method of the present invention may be one having many layers (films) formed on the base material B as shown in FIG. 2. In order to minimize the reduction of the gas barrier properties due to pin holes, a plurality of gas barrier layers may often be formed with different layers interposed therebetween.

For example, the embodiment shown in FIG. 2 may be such that layers b, d and f are the gas barrier layers and layers a, c and e are layers having other functions.

The travel speed of the substrate Z is of course well known. Therefore, it is possible to detect the improper region under time control. However, in cases where the multi-layered gas barrier film is formed as described above, mounting of the substrate roll 20 on the rotary shaft 24 and traveling of the substrate to the take-up shaft 30 may very often cause errors in the position of the improper region under time control.

In this regard, marking which is capable of visual detection (i.e., detection with visible light) such as marking with laser beams or which is capable of detection with, for example, infrared light ensures the detection of the improper region even in cases where such multi-layered gas barrier film is formed.

Therefore, even in cases where such multi-layered gas barrier film is formed, the marking operation ensures that the improper region in each layer of the multi-layered gas barrier film is detected to prevent improper products from being provided.

The substrate Z having the gas barrier layer formed thereon (i.e., gas barrier film) travels from the drum 36 to the guide roller 42 and is guided by the guide roller 42 to pass through a slit 57a formed in a partition wall 57 separating the film deposition chamber 14 from the take-up chamber 16, thus reaching the take-up chamber 16.

In the illustrated embodiment, the take-up chamber 16 includes the guide roller 58, the take-up shaft 30 and the vacuum evacuation means 60.

The substrate Z (gas barrier film) having reached the take-up chamber 16 travels to the take-up shaft 30 as it is guided by the guide roller 58 and is wound on the take-up shaft 30 to form a roll, which is then supplied to the subsequent step as a roll of gas barrier film.

The take-up chamber 16 is also provided with the vacuum evacuation means 60 as in the above-described feed chamber 12 and during film deposition, its pressure is reduced to a degree of vacuum suitable for the film deposition pressure in the film deposition chamber 14.

In the film deposition chamber 14 of the illustrated production device 10, the control means 56 is of a configuration capable of feedback control of the plasma excitation power from the RF power source 48, the amount of at least one material supplied from the gas supply means 46, and the amount of air discharged by the vacuum evacuation means 50 based on the measurement results of the emission intensities A to D from the plasma emission measurement means 52.

However, this is not the sole case of the present invention, and only one of the plasma excitation power, amount of at least one material supplied and the degree of vacuum (pressure) may be controlled (with a controllable unit). Alternatively, at least two of the plasma excitation power, amount of at least one material supplied and the degree of vacuum may be controlled (with a controllable unit). The substrate bias power may be controlled alone or in combination with the excitation power or the like.

At least the plasma excitation power is preferably controlled to use the plasma that has the emission intensities A to D satisfying formulas a to c to thereby form the gas barrier layer.

While the method of producing a gas barrier layer according to the present invention has been described above in detail, the present invention is by no means limited to the foregoing embodiments and it should be understood that various improvements and modifications may of course be made without departing from the scope and spirit of the invention.

For example, the production device 10 shown in FIG. 1 is a device for producing the gas barrier layer by a roll-to-roll system. However, the present invention is not limited to this but may be used in a so-called batch type production device.

EXAMPLES

A common CVD device for depositing a film by CCP-CVD was used to form a gas barrier layer on a substrate.

The substrate used was a PET film (Lumirror T60 available from Toray Industries, Inc.; total light transmittance: 89%) with a thickness of 100 μm. The substrate had an area of 300 cm$^2$.

A gas material including silane gas ($SiH_4$), ammonia gas ($NH_3$), nitrogen gas ($N_2$) and hydrogen gas ($H_2$) was used.

The power source used was an RF power source at a frequency of 13.56 MHz.

The substrate was set on a substrate holder in a vacuum chamber of the CVD device and the vacuum chamber was closed. Then, the vacuum chamber was evacuated and the gas material was introduced into the vacuum chamber at the point in time when the pressure dropped to 0.01 Pa.

Once the pressure in the vacuum chamber had stabilized, the plasma excitation power was supplied from the RF power source to the electrode to deposit a gas barrier layer on the substrate surface to prepare a gas barrier film having the PET film as the substrate. The gas barrier layer was deposited to a thickness of 50 nm. The film thickness was controlled based on previously conducted experiments. During film deposition, the temperature adjusting means built into the substrate holder was used to adjust the temperature of the substrate to 80° C. or less.

During the deposition of the gas barrier layer, a plasma emission monitor (spectrometer HR4000 available from Ocean Optics, Inc.) was used to measure the emission intensity A of emission at 414 nm (mainly derived from SiH radicals), the emission intensity B of emission at 336 nm (mainly derived from NH radicals), the emission intensity C of emission at 337 nm (mainly derived from $N_2$ radicals), and the emission intensity D of emission at 656 nm (mainly derived from H radicals).

The film deposition pressure was changed in the range of 20 Pa to 250 Pa by adjustment with the amount of discharged air and the gas flow rates, and the plasma excitation power was changed in the range of 200 W to 1000 W to appropriately modify the emission intensities A to D, whereby in total 10 types of gas barrier films were prepared in Examples 1 to 4 and Comparative Examples 1 to 6.

In Examples 3 and 4, and Comparative Example 6, the film deposition pressure and the total gas flow rate (sum of the flow rates of the introduced gases) were the same. The sum of the flow rates of the gases refers to the maximum flow rate at which the vacuum evacuation means can maintain the film deposition pressure in the CVD device used.

The ratios B/A, C/B, and D/B of the emission intensities in each gas barrier film are shown in Tables 1 and 2. Examples 1 and 2, and Comparative Examples 1 to 5 are shown in Table 1, whereas Examples 3 and 4 and Comparative Example 6 are shown in Table 2. Table 2 also shows the film deposition rate (static film deposition rate) (nm/min) in Examples 3 and 4, and Comparative Example 6.

Each of the prepared gas barrier films was subjected to the measurement of moisture vapor transmission rate, oxidation resistance and total light transmittance. The flexibility was also measured in Examples 3 and 4, and Comparative Example 6.

Moisture Vapor Transmission Rate

The moisture vapor transmission rate [g/($m^2$·day)] was measured by the MOCON method. Those samples which exceeded the limit for measurement of the moisture vapor transmission rate by the MOCON method were measured for the moisture vapor transmission rate by the calcium corrosion method (see JP 2005-283561 A).

Oxidation Resistance

The gas barrier film was subjected to a storage test in an environment of 85° C. and 85% RH for 1000 hours. The composition of the film before and after the storage was determined by X-ray photoelectron spectroscopy (abbreviated as XPS; Quantera SXM available from Ulvac-Phi, Incorporated) to evaluate the oxidation resistance of the film. The surface and interface portions that were already oxidized before the storage were removed from the whole film and the remaining region with a film thickness of 5 to 45 nm was rated for the ratio of oxygen to nitrogen (O/N value) based on the following criteria:

Good: The difference between before and after the storage is within ±3% (substantially no change);

Fair: The ratio increase from before to after the storage is less than 10%;

Poor: The ratio increase from before to after the storage is 10% or more.

Total Light Transmittance

A spectrophotometer (U-4100 available from Hitachi High-Technologies Corporation) was used to measure the average transmittance at a wavelength of 400 to 700 nm of the film including the PET substrate.

Flexibility

The prepared gas barrier film was wound around a cylindrical bar with a diameter of 10 mm to form 100 layers thereon, and observed with an optical microscope or a scanning electron microscope if cracking occurred.

A gas barrier film in which no cracking could be confirmed was rated as "good".

A gas barrier film in which cracking could be confirmed was rated as "poor".

Comprehensive Evaluation

The evaluation criteria used include a moisture vapor transmission rate of not more than $3 \times 10^{-3}$ [g/(m$^2$·day)], good oxidation resistance and transparency of at least 88%.

The gas barrier film was rated as "good" when the three evaluation criteria were met.

The gas barrier film was rated as "fair" when the moisture vapor transmission rate and one of the remaining evaluation criteria were met.

The gas barrier film was rated as "poor" when the evaluation criterion of the moisture vapor transmission rate was not met.

The results are shown in Tables 1 and 2.

barrier properties, oxidation resistance in a high temperature and high humidity environment, and transparency. As shown in Examples 3 and 4, the gas barrier layer formed by the production method of the present invention also has excellent flexibility. Since D/B exceeds the preferred range of less than 20, Example 4 is inferior in the film deposition rate to Example 3 but both of the gas barrier layers formed in Examples 3 and 4 have excellent gas barrier properties, oxidation resistance in a high temperature and high humidity environment, and transparency at a film deposition rate in excess of 300 nm/min.

In contrast, Comparative Example 1 having B/A of not more than 2 cannot achieve a sufficient transmittance and Comparative Example 2 having B/A of at least 20 also cannot achieve sufficient oxidation resistance. Comparative Example 3 having C/B of at least 2 cannot achieve sufficient oxidation resistance. Comparative Example 4 having D/B of not more than 0.5 and Comparative Example 5 having B/A of at least 20 and D/B of not more than 0.5 do not have sufficient gas barrier properties and oxidation resistance. In addition, Comparative Example 6 having D/B in excess of 50 is inferior in the gas barrier properties and the transmittance and has a low film deposition rate and is therefore disadvantageous in terms of productivity.

The above results clearly show the beneficial effects of the present invention.

TABLE 1

| | Emission intensity | | | Gas barrier properties | Oxidation | Transmittance | Comprehensive |
| --- | --- | --- | --- | --- | --- | --- | --- |
| | B/A | C/B | D/B | [g/(m$^2$·day)] | resistance | [%] | evaluation |
| EX1 | 5.19 | 0.49 | 3.67 | less than 0.001 | Good | 88.4 | Good |
| EX2 | 10.51 | 1.62 | 1.08 | less than 0.001 | Good | 88.4 | Good |
| CE1 | 1.86 | 0.5 | 9.15 | 0.0017 | Good | 81.3 | Fair |
| CE2 | 23.55 | 1.56 | 0.72 | 0.0027 | Fair | 88.5 | Fair |
| CE3 | 17.29 | 2.41 | 0.81 | 0.0022 | Fair | 88.4 | Fair |
| CE4 | 12.37 | 1.22 | 0.33 | 0.0087 | Poor | 88.1 | Poor |
| CE5 | 20.2 | 1.62 | 0.28 | 0.0104 | Poor | 88.3 | Poor |

Emission intensity A: emission at 414 nm mainly derived from Si—H
Emission intensity B: emission at 336 nm mainly derived from N—H
Emission intensity C: emission at 337 nm mainly derived from N$_2$
Emission intensity D: emission at 656 nm mainly derived from H

TABLE 2

| | Emission intensity | | | Gas barrier properties | Oxidation | Transmittance | | Film deposition rate | Comprehensive |
| --- | --- | --- | --- | --- | --- | --- | --- | --- | --- |
| | B/A | C/B | D/B | [g/(m$^2$·day)] | resistance | [%] | Flexibility | [nm/min] | evaluation |
| EX3 | 3.57 | 0.41 | 6.33 | less than 0.001 | Good | 88.6 | Good | 613 | Good |
| EX4 | 4.71 | 0.38 | 22.64 | 0.0014 | Good | 88.5 | Good | 372 | Good |
| CE6 | 1.06 | 0.71 | 51.67 | 0.29 | Good | 66.2 | Poor | 54 | Poor |

Emission intensity A: emission at 414 nm mainly derived from Si—H
Emission intensity B: emission at 336 nm mainly derived from N—H
Emission intensity C: emission at 337 nm mainly derived from N$_2$
Emission intensity D: emission at 656 nm mainly derived from H As is clear from Tables 1 and 2, the gas barrier layer formed by the inventive production method in which film deposition was made with a plasma that had the emission intensities A to D all satisfying formulas a to c is excellent in all of the gas The present invention can be advantageously used in producing various products which are required to include a gas barrier layer having not only high gas barrier properties but also excellent transparency and oxidation resistance, as exemplified by various displays such as liquid crystal displays and solar batteries.

What is claimed is:

1. A method of producing a gas barrier layer comprising:
   using a material having at least one Si—H bond, a material having at least one N—H bond, and at least one of nitrogen gas, hydrogen gas and a noble gas; and
   forming said gas barrier layer by plasma-enhanced CVD using a plasma in which an emission intensity A of emission at 414 nm, an emission intensity B of emission at 336 nm, an emission intensity C of emission at 337 nm, and an emission intensity D of emission at 656 nm satisfy formulas a to c:

$$2<B/A<20 \quad \text{Formula a:}$$

$$C/B<2 \quad \text{Formula b:}$$

$$0.5<D/B<50. \quad \text{Formula c:}$$

2. The method according to claim 1, wherein said emission intensities A to D are measured and at least one of plasma excitation power, pressure control means and each amount of supplied materials is feedback-controlled based on measurement results so that the formulas a to c are satisfied.

3. The method according to claim 1, wherein said gas barrier layer is formed on an elongated substrate traveling in a longitudinal direction.

4. The method according to claim 3, wherein a region where said gas barrier layer was formed in a state in which at least one of the formulas a to c was not satisfied for at least 1 consecutive second is detected.

5. The method according to claim 4, wherein said region is marked where said gas barrier layer was formed in the state in which at least one of the formulas a to c was not satisfied for at least 1 consecutive second.

6. The method according to claim 5, wherein said region is marked with visible marks on said region.

7. The method according to claim 5, wherein said region is marked outside a region for use as a product.

8. The method according to claim 5, wherein said region is marked by laser marking with laser beams.

9. The method according to claim 1, wherein said gas barrier layer is formed on a substrate made of an organic material or a substrate having an organic base material.

10. The method according to claim 1, wherein said gas barrier layer is formed with a substrate temperature kept at 120° C. or less.

11. The method according to claim 1, wherein said gas barrier layer is formed on a substrate and at least a part of a surface of said substrate is formed with an organic material.

12. The method according to claim 1, wherein another gas barrier layer is deposited on a substrate having the gas barrier layer formed by the method according to claim 1.

13. The method according to claim 1, wherein said gas barrier layer is formed as AC or DC bias power is applied to a substrate, said emission intensities A to D are measured and the bias power applied to a substrate is feedback-controlled based on measurement results so that the formulas a to c are satisfied.

14. The method according to claim 1, wherein said gas barrier layer comprises silicon nitride.

15. The method according to claim 1, wherein said material having at least one Si—H bond is silane, disilane, trimethylsilane or combinations thereof.

16. The method according to claim 1, wherein said material having at least one N—H bond is ammonia, hydrazine or combinations thereof.

17. The method according to claim 1, wherein said at least one of nitrogen gas, hydrogen gas and a noble gas comprises nitrogen gas combined with hydrogen gas, nitrogen gas combined with helium gas or nitrogen gas combined with argon gas.

18. The method according to claim 1, using silane gas ($SiH_4$), ammonia gas ($NH_3$), nitrogen gas ($N_2$) and hydrogen gas ($H_2$).

* * * * *